(12) United States Patent
Pfirsch

(10) Patent No.: US 6,531,748 B2
(45) Date of Patent: Mar. 11, 2003

(54) SEMICONDUCTOR POWER COMPONENT WITH A REDUCED PARASITIC BIPOLAR TRANSISTOR

(75) Inventor: Frank Pfirsch, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/853,522

(22) Filed: May 11, 2001

(65) Prior Publication Data

US 2002/0000607 A1 Jan. 3, 2002

(30) Foreign Application Priority Data

May 11, 2000 (DE) .......................... 100 23 115

(51) Int. Cl.$^7$ .............................................. H01L 29/72
(52) U.S. Cl. .................. 257/368; 257/191; 257/192; 257/197; 257/370
(58) Field of Search ................ 257/191, 192, 257/197, 370, 368

(56) References Cited

U.S. PATENT DOCUMENTS

| 4,364,073 A | 12/1982 | Becke et al. |
| 4,620,211 A | 10/1986 | Baliga et al. |
| 4,728,998 A | 3/1988 | Strain |
| 4,767,722 A | 8/1988 | Blanchard |
| 4,809,047 A | 2/1989 | Temple |
| 5,142,641 A | 8/1992 | Fujioka |
| 5,216,271 A | * 6/1993 | Takagi et al. ............... 257/370 |

FOREIGN PATENT DOCUMENTS

JP       10 326 748 A       12/1998

OTHER PUBLICATIONS

"Modern Power Devices" (Jayant Baliga), New York Jan. 1987, pp. 314–16.

* cited by examiner

*Primary Examiner*—Edward Wojciechowicz
(74) *Attorney, Agent, or Firm*—Laurence A. Greenberg; Werner H. Stemer; Gregory L. Mayback

(57) ABSTRACT

A semiconductor power component has a MOS structure in which the source region is formed of a material whose band gap is smaller than the band gap of the material of the channel region. This measure reduces the gain of a parasitic bipolar transistor.

6 Claims, 1 Drawing Sheet

SEMICONDUCTOR POWER COMPONENT WITH A REDUCED PARASITIC BIPOLAR TRANSISTOR

BACKGROUND OF THE INVENTION

Field of the Invention

The invention relates to a semiconductor power component having a source region, a drain region, a channel region provided between the source region and the drain region and an insulated gate provided at a distance above the channel region.

Semiconductor power components, in particular power MOS (Metal Oxide Semiconductor) field effect transistors, for example DMOS (Double-Diffusion Metal Oxide Semiconductor) field effect transistors, include a MOS structure which is essential for their application as electronic switches, for example. The MOS structure is for example a part of a field effect transistor controlled by an insulated gate. The semiconductor power components, in addition to the MOS structure, also contain an undesired parasitic bipolar transistor structure. If an n-channel MOS field effect transistor is considered as an example, its source region and drain region each being n-conductive and a p-conductive body or channel region being provided between the source region and the drain region, then the source region, the channel region and the drain region here form a parasitic npn bipolar transistor.

The breakdown voltage of such a parasitic bipolar transistor with open base, which leads to a so-called $U_{CEO}$ breakdown, as it is known, is generally considerably lower than the breakdown voltage of the MOS field effect transistor, that is to say for example of a DMOS field effect transistor, depending on the gain of the bipolar transistor. For example, the breakdown voltage of the parasitic bipolar transistor may be 50% or less of the breakdown voltage of the actual DMOS field effect transistor.

In order to be able to utilize the voltage range of the DMOS field effect transistor up to its breakdown voltage and, if appropriate, to be able to reach the breakdown voltage of the DMOS field effect transistor, the channel region and the source region must be short-circuited to each other by the source contact. However, such a short circuit always entails a series resistance, which is formed of the path resistance in the channel region.

In the case of an n-channel MOS field effect transistor, this path resistance in the channel region leads to the situation where, at high hole current densities such as occur in the case of an avalanche or in the case of a fast voltage rise at the pn junction, in particular after the inverse diode has been flooded with excess charge carriers, the pn junction between the source region and the channel region is nevertheless polarized in the forward direction. As a result, the short circuit between the source region and the channel region via the source contact becomes virtually ineffective, which permits the voltage to break down to the $U_{CEO}$ breakdown voltage value of the bipolar transistor.

As a result of this process, the MOS field effect transistor is generally destroyed, since the gate loses its controlling action and the current can no longer be turned off. This socalled "bipolar second breakdown" is also explained, inter alia, in B. Jayant Baliga: Modern Power Devices, New York 1987, pp. 314–316.

The problem indicated above has been known for a long time. Accordingly, there is already a large number of approaches to overcome it, which are predominantly based on the fact of making the maximum controllable hole current as high as possible through the use of a good short circuit between the source region and channel region.

A high hole current can be obtained in an n-channel MOS field effect transistor in that, for example, an additional p-conductive region with a high conductivity is provided underneath the source region, as proposed in U.S. Pat. No. 4,809,047. Another route is to ensure the shortest possible path over which the hole current has to flow laterally under the source region in the p-conductive channel region (of. U.S. Pat. No. 4,767,722). In the two cases above, ultimately the voltage drop underneath the source region as far as the source contact is minimized.

Furthermore, U.S. Pat. No. 4,364,073 describes an IGBT (Insulated Gate Bipolar Transistor) in which, through the use of high doping of the channel region and low doping of the source region, the gain of a parasitic npn bipolar transistor can be made sufficiently small that, together with the gain of the parasitic pnp transistor containing the rear p-conductive anode region, the thyristor firing condition is not met.

As described, for example, in U.S. Pat. No. 4,620,211, a further possibility of reducing the gain of a parasitic npn transistor is introducing a zone with a high recombination speed, for example a metallic contact, into the channel region underneath the source region. This procedure is particularly suitable for transistors which are capable of being reverse biased and which contain no short circuit between the source region and drain region, so that the pn junction between source region and channel region is able to accept voltage in the reverse direction.

In the case of integrated circuits using CMOS (Complementary Metal-Oxide Semiconductor) technology, CMOS-ICs (Complementary Metal-Oxide Semiconductor Integrated Circuits), as they are known, adjacent n-channel MOS field effect transistors and p-channel MOS field effect transistors together form thyristor structures. Under unfavorable conditions, for example high temperatures and a sudden voltage rise, the thyristor firing condition can be met in such a thyristor structure, which leads to a rapid current rise and to destruction of the integrated circuit. A so-called "latch-up" occurs. U.S. Pat. No. 4,728,998 and U.S. Pat. No. 5,142,641 specify how, by reducing the emitter efficiency of the source regions, the latch-up phenomenon can be prevented. Reducing the emitter efficiency is in this case achieved by producing the source regions from SiGe.

Finally, U.S. Pat. No. 5,216,271 discloses the practice of using a material with a low band gap in order to achieve low contact resistances in BICMOS (Bipolar Complementary Metal Oxide Semiconductor) components.

SUMMARY OF THE INVENTION

It is accordingly an object of the invention to provide a semiconductor power component which overcomes the above-mentioned disadvantages of the heretofore-known components of this general type and in which it is possible to avoid turning on a parasitic bipolar transistor in a reliable and simple manner.

With the foregoing and other objects in view there is provided, in accordance with the invention, a semiconductor power component, including:
  a source region formed of a first material having a first band gap;
  a drain region;
  a channel region disposed between the source region and the drain region, the channel region being formed of a second material having a second band gap, the first band gap being smaller than the second band gap; and
an insulated gate disposed at a given distance above the channel region.

In other words, the object of the invention is achieved by forming the source region of a material whose band gap is smaller than that of the material of the channel region.

According to another feature of the invention, the first band gap is at least 0.1 eV smaller than the second band gap. Preferably, the first band gap is substantially 0.2 eV smaller than the second band gap.

According to a further feature of the invention, the semiconductor power component is an n-channel MOS field effect transistor or an IGBT.

In this case, a semiconductor power component is to be understood as an n-channel or a p-channel MOS field effect transistor, such as in particular a lateral or vertical DMOS transistor with a planar gate, a power transistor with a trench gate, a UMOS (U-Shaped Trench Metal-Oxide Semiconductor) transistor or corresponding IGBTs which, between the drain region and drain contact, also contain a doping region with a conduction type opposite to the drain doping.

In this case, the channel region generally has a conduction type which is opposite to that of the source region and of the drain region. However, it can also have the same conduction type in the case of "normally-on" transistors.

In the semiconductor power component according to the invention, therefore, the source region is formed of a semiconductor material with a smaller band gap than the band gap of the material in the channel or body region. Since the minority charge carrier current in the source region depends exponentially on the difference in the band gaps between channel region and source region, the gain of the parasitic bipolar transistor, that is to say for example that of the parasitic npn transistor, decreases accordingly. This decrease is approximately one order of magnitude per 60 meV.

In this way, a low gain of the parasitic bipolar transistor can be achieved without having to choose doping ratios which are unfavorable for other characteristics of the power component. As is known, for example a high doping in the channel region would lead to a high turn-on voltage, while a low doping in the source region would result in a high contact resistance.

The invention can advantageously also be applied to power MOS field effect transistors without a short circuit between source region and channel region. In these transistors the production of a zone with a high recombination speed, which is difficult to implement, can thus be avoided.

The invention advantageously makes use of the effect of an increase in the transistor gain through the use of materials with a different band gap, as is known from hetero-bipolar transistors (HBP). However the invention uses the effect in the opposite direction so to speak. By producing the source region from a material with a smaller band gap than that of the material of the channel region, the gain of the parasitic bipolar transistor is reduced, in order thus to provide semiconductor power components which are improved with regard to their robustness, such as in particular power MOS field effect transistors and IGBTs.

The semiconductor power component according to the invention can be produced simply, for example with the aid of the methods known from hetero-bipolar transistors. Considered for this purpose is, for example, selective epitaxy or germanium implantation, in order to produce the source region from SiGe in the case of a silicon power component (in this regard, cf. also U.S. Pat. No. 5,216,271). Another possibility of forming a SiGe layer is selective CVD (Chemical Vapor Deposition).

Other suitable combinations of semiconductor materials are, in addition to the above-mentioned combination of Si and SiGe, Si and InAs, Si and InSb, SiGe and Ge, Ge and GeSn, GaAs and Ge, InP and GeSn, InP and InGaAs, InP and PbS, SiC and Si and also InAs and PbSnSe.

Other features which are considered as characteristic for the invention are set forth in the appended claims.

Although the invention is illustrated and described herein as embodied in a semiconductor power component with a reduced parasitic bipolar transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
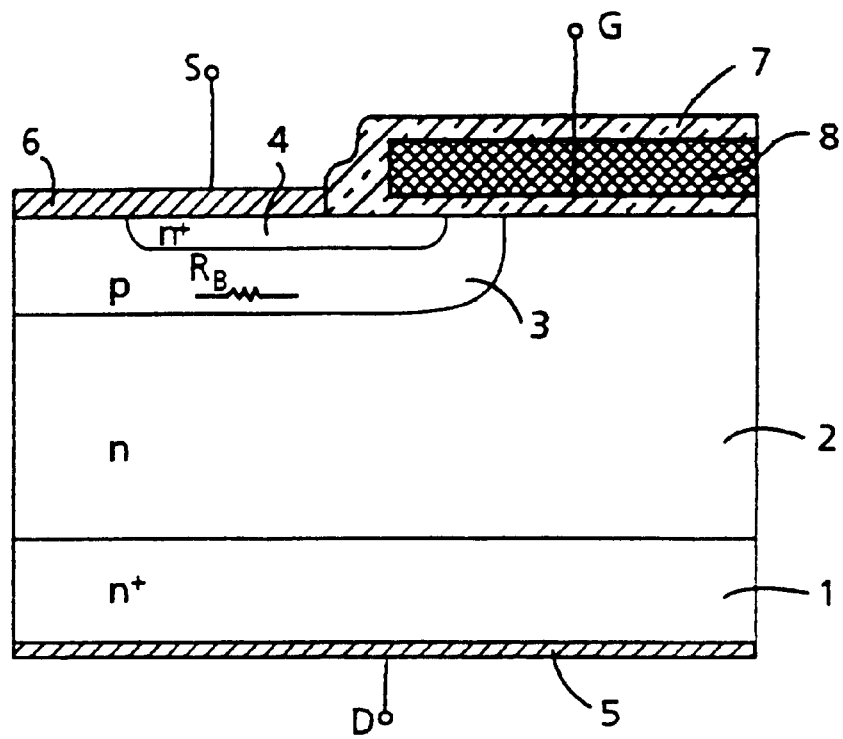
FIG. 1 is a diagrammatic, partial sectional view of a power MOS field effect transistor for illustrating an exemplary embodiment of the invention.

Referring now to the figures of the drawings in detail and first, particularly, to FIG. 1 thereof, there is shown a power MOS field effect transistor which includes an n$^+$-conductive silicon substrate 1, to which an n-conductive silicon layer 2 is applied. In this silicon layer 2 there is a p-conductive channel or body region 3 of silicon, in which in turn an n$^+$-conductive source region 4 of SiGe is included.

The silicon substrate 1 is provided with a drain contact 5, while a source contact 6 is applied to the source region 4 and the channel region 3. Finally, a gate electrode 8 made of polycrystalline silicon, for example, is also embedded in an insulating layer 7 made of silicon dioxide, for example. An IGBT has a structure with elements corresponding to the elements shown in FIG. 1.

Figure 2:
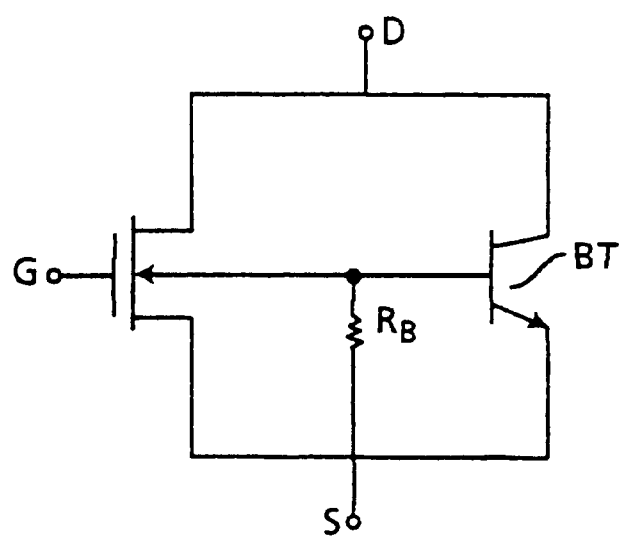
FIG. 2 is a schematic equivalent circuit of the field effect transistor of FIG. 1.

FIG. 2 shows an equivalent circuit of the power MOS field effect transistor of FIG. 1, with a source connection S, a gate connection G and a drain connection D. The path resistance of the channel region 3 is symbolized by $R_B$.

By using a material with a smaller band gap for the source region 4 than for the channel region, the gain of the parasitic bipolar transistor BT including the source region 4, the channel region 3 and the layer 2 and also the substrate 1 can be made small, so that even a very high hole current does not result in the parasitic bipolar transistor BT being turned on.

The band gap of the material of the source region should be at least 0.1 eV smaller than the band gap of the material of the channel region. It is particularly advantageous if the band gap of the material of the source region is about 0.2 eV smaller than the band gap of the material of the channel region.

I claim:

1. A semiconductor power component, comprising:
   a source region entirely formed of a first material having a first band gap;

a drain region;

a channel region disposed between said source region and said drain region, said channel region being formed of a second material having a second band gap, said first band gap being smaller than said second band gap; and an insulated gate disposed at a given distance above said channel region.

2. The semiconductor power component according to claim 1, wherein said first band gap is at least 0.1 eV smaller than said second band gap.

3. The semiconductor power component according to claim 2, wherein said first band gap is substantially 0.2 eV smaller than said second band gap.

4. The semiconductor power component according to claim 1, wherein said first material and said second material are combinations selected from the group consisting of Si and SiGe, Si and InAs, Si and InSb, SiGe and Ge, Ge and GeSn, GaAs and Ge, InP and GeSn, InP and InGaAs, InP and PbS, SiC and Si, and InAs and PbSnSe.

5. A semiconductor configuration, comprising:

an n-channel MOS field effect transistor including:

a source region entirely formed of a first material having a first band gap;

a drain region;

an n-channel region disposed between said source region and said drain region, said n-channel region being formed of a second material having a second band gap, said first band gap being smaller than said second band gap; and an insulated gate disposed at a given distance above said channel region.

6. A semiconductor configuration, comprising:

an IGBT component including:

a source region entirely formed of a first material having a first band gap;

a drain region;

a channel region disposed between said source region and said drain region, said channel region being formed of a second material having a second band gap, said first band gap being smaller than said second band gap; and an insulated gate disposed at a given distance above said channel region.

* * * * *